(12) United States Patent
Hämäläinen et al.

(10) Patent No.: US 6,835,923 B2
(45) Date of Patent: Dec. 28, 2004

(54) METHOD AND APPARATUS FOR SELF-MONITORING OF PROXIMITY SENSORS

(75) Inventors: Tiina Hämäläinen, Trc (FI); Henri Vähä-Ypyä, Tampere (FI); Risto Pirhonen, Tampere (FI); Vesa Peili, Tampere (FI)

(73) Assignee: Nokia Corporation, Espoo (FI)

( * ) Notice: Subject to any disclaimer, the term of this patent is extended or adjusted under 35 U.S.C. 154(b) by 122 days.

(21) Appl. No.: 09/987,987

(22) Filed: Nov. 16, 2001

(65) Prior Publication Data

US 2003/0094566 A1 May 22, 2003

(51) Int. Cl.⁷ ............... G01J 1/04; G02B 6/26
(52) U.S. Cl. ............... 250/227.11; 250/227.24; 250/221; 356/73.1; 385/31
(58) Field of Search ............... 250/227.11, 227.24, 250/221, 222.1; 356/4.01, 4.07, 73.1; 385/12, 31, 33, 36, 88, 89, 93

(56) References Cited

U.S. PATENT DOCUMENTS 5,382,785 A   1/1995   Rink 6,087,653 A * 7/2000 Van Schyndel et al. 250/227.11

FOREIGN PATENT DOCUMENTS

| DE | 3619209 | 12/1987 | |
| GB | 2178840 | 2/1987 | ........... G01B/11/14 |
| JP | 59083025 | 5/1984 | |
| JP | 60095373 | 5/1985 | |

* cited by examiner

Primary Examiner—Kevin Pyo
(74) Attorney, Agent, or Firm—Antonelli, Terry, Stout & Kraus, LLP

(57) ABSTRACT

The present invention relates to proximity sensors. It also relates to proximity sensors in electronic devices using lightguides. More specifically the invention relates to a simple self monitoring of optical proximity sensors. This can be achieved according to one embodiment of the present invention by a system of lightguides for the use in proximity sensor. The lightguide system comprises a transceiver lightguide to direct-transmitter to a predefined direction, and a receiver lightguide to direct transmitter light reflected from an object towards a receiver, where the transceiver and receiver lightguides comprise diffracting surfaces to direct a part of-the light from the transmitter as a self monitoring beam in a direction towards a receiver.

13 Claims, 3 Drawing Sheets

METHOD AND APPARATUS FOR SELF-MONITORING OF PROXIMITY SENSORS

BACKGROUND OF THE INVENTION

1. Field of the Invention

The present invention relates to proximity sensors. It also relates to proximity sensors in electronic devices using beam guides. More specifically the invention relates to a self monitoring of the operability of optical proximity sensors and a method of its operation. In particular the invention relates to a method of monitoring a sensor, a lightguide systems for use with the sensor and a device including the sensor.

2. Description of the Prior Art

The basic functioning of optical proximity sensors is described in GB2178840. The optical proximity sensors of British Patent 2,178,840 comprise two optical fibers. However in this patent there is no mention of a self-monitoring signal and it does not have any prisms that direct a self-monitoring signal from a transmitter to a detector.

To guarantee proximity sensor's functioning a self-monitoring of the system is very important. There are several ways to do this but in optical proximity sensors this is normally done by reflecting a signal back to the proximity sensor and using this reflected signal as a control signal for self-monitoring. In proximity sensors, where there are different lightguides for the transmitter and the detector, self-monitoring is normally done so that external prisms or reflectors reflect part of the signal coming from the transmitter back to the detector. A problem associated with this solution is that external parts are easily damaged and this could affect the functionality of the device.

In U.S. Pat. No. 5,382,785 a photodiode is used to self-monitor the function of a proximity sensor with a laserdiode. In this system part of the signal is reflected by a partially reflecting mirror of a laser diode and this reflection is used in control of the system. Further, this document does not mention the use of the prisms and two lightguides.

It is desired to create a self-monitoring signal that reflects changes in the proximity detector performance so, that all possible failure conditions are detected, but no false detection happen. An easy way to make this signal is by the provision of an external prism or other external reflecting features. These external features are most easily damaged and functionality of the device deteriorates.

FIG. 1 depicts a conventional version of an optical proximity sensor with a conventional two lightguide design. This picture is incorporated to describe the fundamental structure of an optical proximity sensor. The proximity sensor comprises a transmitter 2, a transmitter lightguide 4, a receiver lightguide 8 and a receiver 10. The lightguide 4 directs light emitted from the transmitter 2 to an area in which an object is to be expected. If there is an object present the light from the transmitter is reflected and led by the receiver lightguide 8 to the receiver 10. The lightguides 4 and 8 further comprise external prisms 6a and 6b that project over the surface of the casing 12. The transmitter 2 and the receiver 10 are welded to a printed circuit board (PCB) 16. The lightguides 4 and 8 are carried in hollow tubes 14 that are attached to a casing 12. The hollow tubes 14 and the PCB 16 are connected flexibly.

FIG. 2 depicts a partially enlarged view of the lightguides of the optical proximity sensor of FIG. 1. The lightguides 4 and 8 further comprise external prisms 6a and 6b that project over the surface of the casing 12. These prisms direct a part of the light 20 emitted from the transmitter via a prism 6a and 6b directly from the transmitter lightguide 4 to the receiver lightguide 8. This part of the light directed from prism 6a to prism 6b is called self monitoring beam 22. The rest of the light 20 from the transmitter is directed as an object illumination beam 28 to an area in which an object is to be expected. The self monitoring beam 22 is directed by the prism 6b of the receiver lightguide 8 towards a receiver (not shown), and further to the receiver. In the area between the both prisms 6a and 6b the self monitoring beam 22 can also be called an overflow signal. So the receiver can receive a minimum radiation, even if no object is in the proximity. The receiver can therefore detect, if the transmitter is transmitting and or the receiver is receiving, even in the absence of an object. The prisms therefore can provide a self test signal. So the normal curve relating the proximity of an object with a signal from the receiver is superimposed with a non zero base signal.

FIG. 3 depicts an enlarged detail of FIG. 2 illustrating the external prisms 6a and 6b. The route of the overflow signal 22 is presented in the picture. The main drawbacks of conventional optical proximity sensor design with lightguides and external prisms is depicted. The light 20 from a transmitter enters the prism 6a of the tx-lightguide 4 (lightguide of the transmitter) from below. Most of this light 20 is passed from the surface of the lightguide 4 as an object illumination beam 28. The prism 6a of the tx-lightguide 4 (lightguide for emitter) reflects a small part of the light 22 in a direction to a prism 6b on the rx-lightguide 8 (lightguide for the receiver). The part of the light 20 intended to be reflected as beam 22 to the other prism is depicted as the ten rays with the arrowhead within the tx-lightguide 4.

The prism 6a of the tx-lightguide 4 (lightguide for emitter) has some disadvantageous external influences. The prism 6a has a broken tip 42 and a scratch 44 as a result of wearing, as a prism 6a projects from the surface of the lightguides of the sensor. The prism further comprises two edges contaminated with soiling. The first soiling is a liquid pollution 46 and the second soiling is a solid pollution 48. The above influences affect the transmission of the self monitoring beam 22 in different ways. The broken tip 42, the liquid soiling 46 and the scratch 44 produce stray light 26. The solid soiling 48 absorbs transmitter light 20 and part of the overflow signal 22. These disadvantageous effects reduce the intensity of the self monitoring beam down to approximately 10%. This leads to a reflection intensity which is too low, so that the receiver detects a faulty transmission, being interpreted as a sensor failure. The failure is detected as the self monitoring beam 22 vanishes. The vanishing of the overflow signal 22 can be related to a real breakdown or a soiling of a small area (the prisms 6a, 6b) on the lightguides 4, 8.

So with a sensor as described above the sensor indicates a failure even if the surface of the lightguides may only be slightly contaminated.

In the earlier solution there were prisms provided on top of the lenses. They were subject to wearing and also collected dirt. This caused the self-monitoring signal to fall under a threshold even in conditions where detecting the object would happen reliably.

So it is desirable to have a proximity sensor that provides a self-monitoring signal in a reliable way even under wearing and dusty conditions, and that is easily manufactured.

SUMMARY OF THE INVENTION

According to one embodiment of the present invention a method is provided for self-monitoring the operation of a proximity sensor. The proximity sensor comprises at least a transmitter, a receiver, and a first and second lightguide. The method can be executed as follows: Producing a beam with the transmitter, and transmitting the beam into the first lightguide. The beam can be a radiation, for example infra red light, visual light or radio waves emitted from the transmitter. Within the first lightguide the beam is split into a first beam and a second beam. The second beam is transmitted into the second lightguide, and is directed towards the receiver. The receiver receives and analyzes the second beam to determine the operation of the proximity sensor.

This basic method describes the return of a part of the beam from the transmitter directly to the receiver. This part received can be used to detect if the transmitter is operating properly, if no object is in proximity and if the lightguides are not damaged.

The beam can be used to travel along a light path with the lightguides to detect non-transparent sections within the lightguides reducing the operability of the proximity sensor. The non-transparent sections may be made dirty by dust, soil or damaged, in particular the lightguides. The operation of the transmitter and the receiver maybe checked the same way. If the receiver cannot receive a beam, at least one of the transmitter, the lightguides and/or the receiver is not operable.

Preferably, the step of receiving and analyzing is executed by detecting the beam by the receiver. This can simplify the analysis of the operability of the sensor, It is preferred to make the two lightguides in one piece so that the lightguides can integrally formed in one process.

It is to be noted that in the simplest case, the transmitter can transmit the beam continuously. In this case, the self monitoring beam provides a signal indicating that the transmitter is operating, even in the absence of a reflecting object. To save energy, the transmitter may only be activated in intervals. A beam transmitted in intervals can be utilized to detect for example stray light deceiving the proximity of an object. If the transmitter modulates the incident light with a code, the interference of the code can be used to determine a difference in the beam paths of the object beam and the self monitoring beam, It should be noted, that the receiver may also receive light reflected from an object, if such a reflective object is present. Further, it is preferred that the proximity sensor does not receive stray light from objects or lights sources in the environment. Such efforts may be reduced by the use of a monochromatic laser diode as a transmitter and filter for the receivers. The fact, that the self monitoring beam is led outside of the sensor enables interruptions of the self monitoring beam caused for example by environmental influences. So an interruption of the self monitoring beam may indicate a transmitter or lightguide failure, or that an object is very close to or resting on the sensor. A transmitter failure may also be recognized by variation in the power consumption of the transmitter.

According to another aspect of the present invention a lightguide system for the use in a proximity sensor is provided. The lightguide system comprises a first and a second lightguide to direct an incident beam and a reflection of the first beam to a first and second predefined direction. These lightguides may be used to direct a beam for example light from a transmitter in to a first direction (in which the proximity of an object is to be determined), and to direct the reflection of the beam to a second direction (in which a receiver may receive the reflection). The first lightguide further comprises a beam splitter to split an incident beam into a first and a second beam and a directing device which directs the second beam from the first lightguide to the second lightguide. The second light guide comprises a directing device which directs the second beam into the second predefined direction.

So a beam of incident light can be split into two beams, wherein one of them is directed into a first direction (for example in which an object is to be expected) and the other is directed towards a second direction (for example in which a receiver is to be expected). With such a lightguide, a receiver can receive permanently light directly from the transmitter, and can therefore decide is the transmitter operating. If the second beam is directed on a path which is related to the operability of the lightguides, for example along outer surfaces of the lightguides, the intensity of the second beam is related to the operability of the lightguides.

It should be noted that the directing device can be reflection device, for example reflecting surfaces, mirrors, refraction devices, diffraction devices or the like.

Preferably the beam splitter is a directing device. So the beam splitter may be embodied for example as a reflecting surface covering only a part of the beam path. The beam splitter can be conventional beam splitter as, for example a dichroitic mirror, a diffraction grating, or the like.

Preferably, the directing device is arranged in a way that the second beam emerges from the first lightguide and is incident onto the second lightguide via the same surfaces as the first beam. So that the second beam travels outside of the proximity sensor. The second beam may therefore be utilized to detect a transmitter failure and/or an object so close that it interrupts the second beam. The transmitter failure may be damage of for example the surfaces of the lightguides of which the first beam comes out of the first lightguide and the second lightguide collects the reflection beam.

Conveniently, the directing device is arranged in a way such that the second beam emerges from the first lightguide and is incident to the second lightguide via other surfaces that the first beam. So the second beam travels inside of the proximity sensor. Such a lightguide design comprises different advantages, so the second beam may be guided via an additional lightguide from the transmitter lightguide to the receiver lightguide. The lightguides may be manufactured as a single part case of for example IR transparent plastic, With such a design, the number of parts in the proximity sensor can be reduced. Such a design further ensures that the areas in which the transmitted light is directed to and the reflected light is receives from are overlapping. Such a design further ensures that the receiver diode can receive the self monitoring beam to detect a transmitter failure.

According to another aspect of the present invention a proximity sensor is provided. The proximity sensor comprises a transmitter, a receiver, and a lightguide system as previously described.

It should be noted, that the first and second lightguides can be single parts, or that the first and/or second lightguide may be constituted by a number of single sub-lightguides. So the invention may be used in proximity sensors that can not only detect the proximity of an object, but the position of the object and the like, too. So the first lightguide may be a single light guide surrounded by a number second lightguides to constitute a sensor able to detect for example rims of objects.

Preferably the proximity sensor further comprises a processor electrically connected to the receiver. Provided with a processor, the proximity sensor may be able to generate for example an output directly related to a certain proximity of an object.

According to another aspect of the present invention an electronic device including a proximity sensor is provided. The device can be a computer, a radio and the like. The device can be a personal digital assistant provided with a proximity sensor. The device can be part of a system for example monitoring the behavior or movement of beings or objects. It should be noted, that the proximity sensor comprises a transmitter and receiver, it may also be used as an optical interface, if the device is able to exchange data. Preferably the device is a mobile telephone.

According to one embodiment of the present invention, the problems of the state of the art can be obviated by placing prisms needed for self-monitoring signal creation inside the proximity sensor cover. So there are no delicate fine optical device features outside of device. This increases the functionality and reliability in long term usage of devices. So the invention can provide a way to implement prisms and reflecting surfaces inside the lightguides.

So the device for example a telephone may be able to control a handsfree mode. The handsfree mode can be controlled via a proximity detector. A method to control a handsfree mode may comprise the steps of: monitoring the proximity detector, and adapting a status of a handsfree mode, according to an output of the proximity detector. The proximity sensor can be used to recognize, for example, if the electronic device is held by a user near the users ear, or if the device is placed on a table. This may conventionally be executed by monitoring the light for example from the transmitter reflected by an object to the receiver. The device may be able to recognize the presence of a device carrier by an object in the carrier covering approximately half of the self monitoring beam.

One of the advantages of a proximity sensor according an embodiment of the present invention is that, when upper part of the lightguide is damaged this affects the functionality of the whole sensor. In prior art solutions it was possible that damage would happen only to the prisms and this would mean that self-monitoring became unreliable and could determine that the proximity sensor did not work even if it could have been in perfect condition. With the invention all damage that happens to the upper part of the lightguides affects at the same time both the functioning of the proximity sensor and the self-monitoring system so that both are connected to each other. According to one embodiment of the present invention, one aspect of the invention lies in the implementation of prisms used in self-monitoring inside the lightguides in systems where there are two lightguides.

Proximity sensors according to an embodiment of the present invention benefit from the fact that:

That the most sensitive structures, that is the prisms or reflectors, are placed inside the sensor and are not subject to wearing and mechanical damage.

That, the fastening of the sensor is so designed that grease and water that might get inside the phone due to capillary effect do not cause problems.

That the top surfaces of the lightguides are only slightly curved, so there is no dust trap.

That it is possible to produce the lightguides in high volumes.

It is to be noted that the proximity sensor can be an optical proximity sensor using infrared (IR), visible and/or ultraviolet (UV) light. The proximity sensor may also utilize electromagnetic radiation.

BRIEF DESCRIPTION OF THE DRAWINGS

Reference is made to the attached drawings, wherein elements having the same reference numeral represent like elements throughout and wherein.

DETAILED DESCRIPTION OF THE PREFERRED EMBODIMENTS

Figure 1:
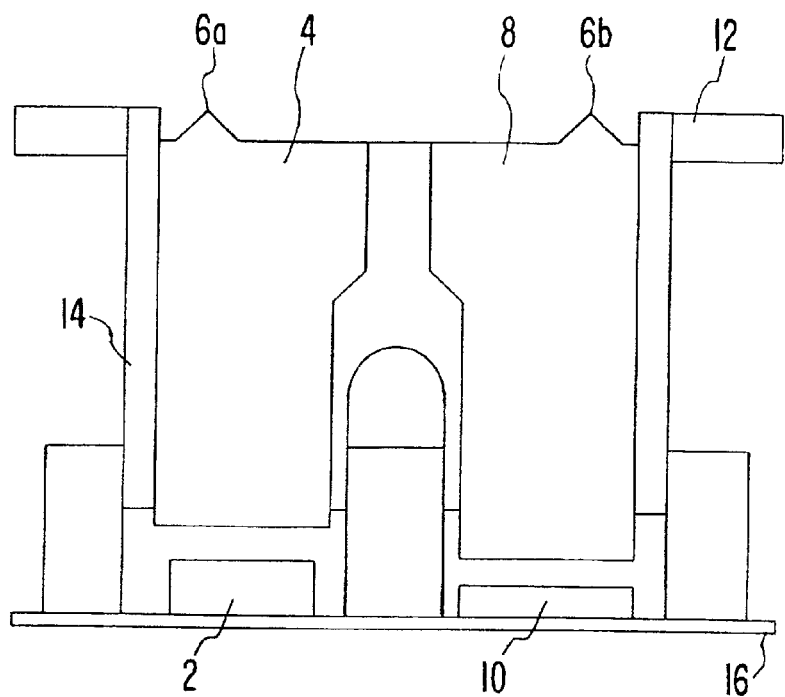
FIG. 1 depicts a conventional version of an optical proximity sensor with a conventional two lightguide design.
Figure 2:
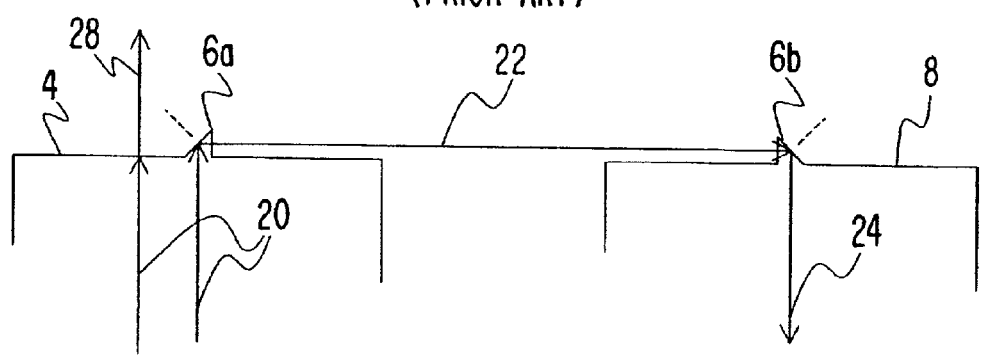
FIG. 2 depicts a partially enlarged view or the optical proximity sensor of FIG. 1.
Figure 3:
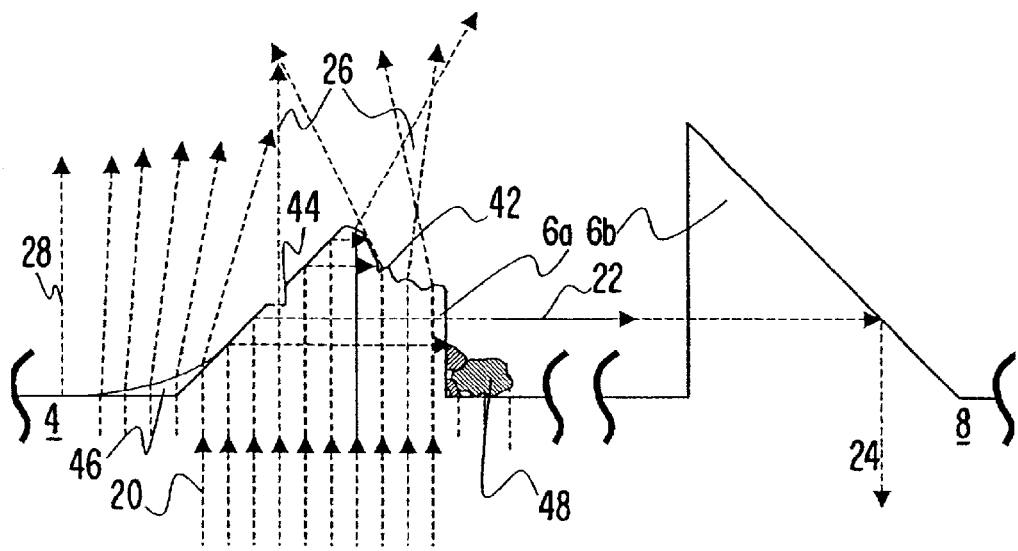
FIG. 3 depicts an enlarged detail of FIG. 2 illustrating the drawbacks of conventional optical proximity sensor design

In the drawings, the single elements of the proximity sensors are named in a slightly different way to increase the clarity of the description of the drawings. In the drawings the first lightguide is called "transmitter- or tx-lightguide". The second lightguide is called "receiver- or rx lightguide". The directing devices are called "prisms". The incident beam is called "transmitter light". The first beam is called "object illumination beam" and the second beam is called "self monitoring beam" or "overflow signal". The reflection of the first beam is called "object beam".

Figure 4:
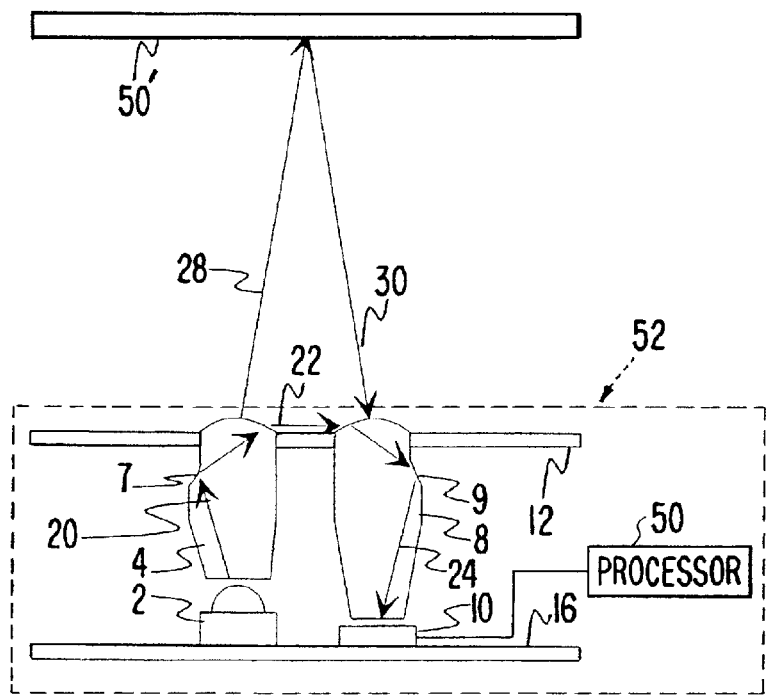
FIG. 4 depicts an optical proximity sensor according to one embodiment of the present invention.

FIG. 4 depicts an optical proximity sensor according to one embodiment of the present invention. As with the proximity sensor of FIG. 1, the present sensor comprises a transmitter 2 and a receiver 10 mounted on a PCB 16, and lightguides 4 and 8 attached to a cover 12. The detailed description of the route of the overflow signal 22 is presented in FIG. 5. The purpose of the prism 7 in the side of the tx-lightguide 4 (lightguide for emitter) is to reflect emitted infrared light 20 to wide area. A small part of reflected light is refracted as the overflow signal 22 from the rounded upper edge of the tx-lightguide towards the rx-lightguide 8 (lightguide for detector). From the rounded edge of the rx-lightguide 8 part of light 22 is refracted towards the prism 9, from which the light is reflected to the detector 10. The majority of the light emitted from the transmitter 2 is guided as an object illumination beam 28 (target beam) to an object 50. The light 30 (the object beam) reflected from the object 50 can reach the rx-lightguide 8 and be transmitted to a detector 10, to generate a signal indicative of the presence or the proximity on an object 50.

Figure 5:
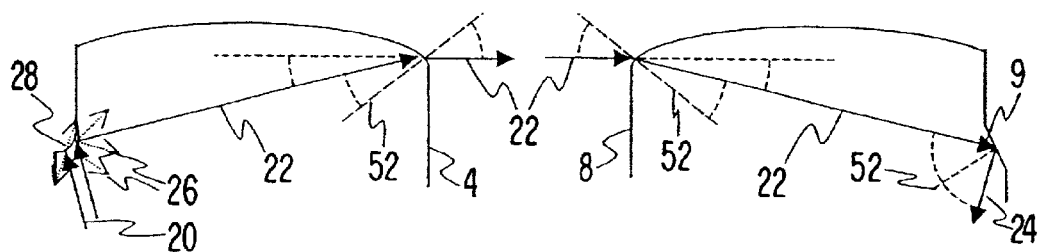
FIG. 5 depicts an enlarged detail of the lightguide of an optical proximity sensor according to an embodiment of the present invention.

FIG. 5 depicts an enlarged detail of the lightguide of an optical proximity sensor according to an embodiment of the present invention. The tx-lightguide 4 of the sensor has a round shaped prism 7 located on the left side. With the round shape a good tolerance for changes in position and properties can be achieved. Infrared light 20 hitting the round shape reflects to wide area. Some of the reflected light is lost as a stray light 26. The amount of the reflected light 22 from the prism can be increased by enlarging the size of the prism 7 (radius and width). The vertical position of the prism determines a point at the upper edge of the lightguide 4, from where the light is refracted towards the rx-lightguide 8. At this point the angle of the normal 52 of the surface (relative to horizontal plane) is same as the angle of refracted light 22.

The operating of the rx-lightguide 8 is the inverse of the tx-lightguide 4. Light 22 coming from the tx-lightguide 4 refracts at the surface towards the prism 9. The prism 9 is flat, because the direction of incoming light is well controlled. The orientation of the prism 9 is such, that light 22 reflects from it as the light 24 to the detector (not shown).

Figure 6:
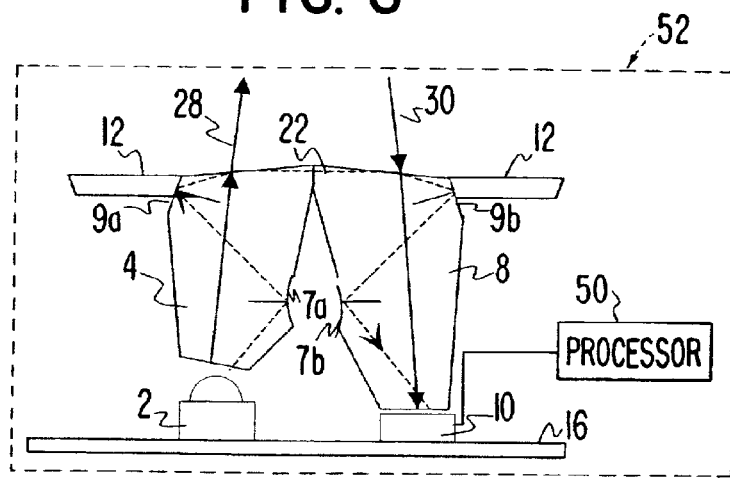
FIG. 6 depicts an optical proximity sensor according to another embodiment of the present invention.

FIG. 6 depicts an optical proximity sensor according to another embodiment of the present invention. The depicted proximity sensor comprises the same elements as the one depicted in FIG. 4. One difference is that the surfaces of the lightguides 4 and 8 are inclined, so, that the lightguides project from the surface of the cover 12. The other difference from FIG. 4 is that there are two prisms in each lightguide, so that the self monitoring beam 22 is reflected two times in each lightguide 4 and 8. This design is advantageous as the self monitoring beam 22 is reflected from the whole outer surface of both lightguides 4, 8, by total reflection and is therefore able to detect even pollution covering the object beam emerging surface, or-to detect scratches in the outer surface. This allows relating the intensity of the self monitoring beam with a quality index indicating the transparency of the light path of the proximity sensor. The illumination area of the object illumination beam 28 and the area from which reflected light is received may be controlled by the design of the surfaces of the lightguides directed to the receiver 10 and the transmitter 2. The prisms 7a and 7b and 9a and 9b may be shaped in a way such that the self monitoring beam is represented by a number of parallel rays. The prisms 7a and 1b and 9a and 9b may be shaped in a way such that the self monitoring beam represents a desired percentage of the emitted radiation.

Figure 7:
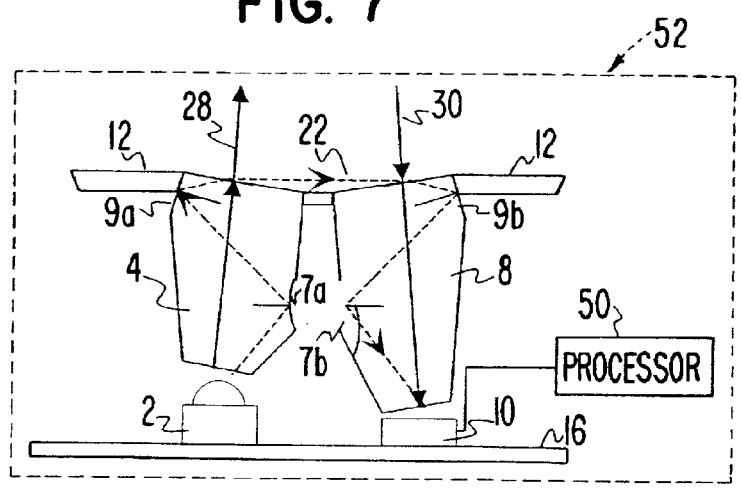
FIG. 7 depicts an optical proximity sensor according to another embodiment of the present invention.

FIG. 7 depicts an optical proximity sensor according to another embodiment of the present invention. The depicted proximity sensor comprises the same elements as the one depicted in FIG. 6. One difference is that the surfaces of the lightguides 4, 8 are inclined towards each other, so that the lightguides are inset from the surface of the cover 12. This design is advantageous as the self monitoring beam 22 illuminates the whole outer surface of both lightguides 4 and 8, and is therefore able to detect even pollution covering the object beam emerging surface. This allows relating the intensity of the self monitoring beam with a quality index indicating the transparency of the light path of the proximity sensor. The receivers 10 of FIGS. 4–7 may be connected to a processor 50. The processor analyzes the self monitoring beam 22 to determine operation of the proximity sensor. The processor 50 relates the intensity of the self monitoring beam 22 with a quality index indicating the transparency of the light path of the proximity sensor. Moreover, the proximity sensor may be part of a mobile telephone generally indicated by reference numeral 52.

This application contains the description of implementations and embodiments of the present invention. It will be appreciated by a person skilled in the art that the present invention is not restricted to details of the embodiments presented above, and that the invention can also be implemented in another form without deviating from the characteristics of the invention. The embodiments presented above should be considered illustrative, but not restricting. Thus the possibilities of implementing and using the invention are only restricted by the enclosed claims. Consequently various options of implementing the invention as determined by the claims, including equivalent implementations, also belong to the scope of the invention.

What is claimed is:

1. A method of self-monitoring operation of a proximity sensor comprising at least a transmitter, a receiver, and first and second lightguides, including the steps of:

producing a beam in the transmitter;

transmitting the beam into the first lightguide with the first lightguide having a surface through which a first light beam is transmitted to exit the first lightguide;

splitting the beam into the first beam and a second beam, within the first lightguide before the first beam is transmitted though the surface of the first lightguide to exit the first lightguide;

transmitting the second beam into the second lightguide;

directing the second beam towards the receiver; and the receiver receiving and analyzing the second beam to determine the operation of the proximity sensor.

2. A method according to claim 1, wherein:

the receiving and analyzing by the receiver is executed by detecting the second beam.

3. A method according to claim 1, wherein: the lightguides are made in one piece.

4. A lightguide system for use with a proximity sensor comprising:

a first lightguide which directs a first beam into a first predefined direction with the first lightguide having a surface through which the first light beam is transmitted to exit the first lightguide;

a second lightguide which directs a reflection of the first beam into a second predefined direction;

a beam splitter within the first lightguide which splits an incident beam into the first beam and a second beam before the first beam before the first beam is transmitted through the surface of the first lightguide to exit the first lightguide;

a beam directing device which directs the second beam from the first lightguide the second lightguide; and the second light guide comprises a beam directing device, which directs the second beam into the second predefined direction.

5. A lightguide system according to claim 4, wherein:

the beam splitter is a light directing device.

6. A lightguide system according to claim 4, wherein:

the beam directing device directs the second beam from the first lightguide to the second lightguide via surfaces which also direct the first beam.

7. A lightguide system according to claim 4, wherein:

the second beam is directed from the first lightguide to the second lightguide via surfaces which did not direct the first beam.

8. A lightguide system according to claim 4 wherein:

the lightguides are made in one piece.

9. A proximity sensor, comprising:

a transmitter comprising a first lightguide which directs a first beam into a first predefined direction and which includes a surface through which the first beam is transmitted to exit the first lightguide;

a receiver;

a lightguide system used with the receiver;

a second lightguide which directs a reflection of the first beam into a second predefined direction;

a beam splitter within the first lightguide which splits an incident beam into the first beam and into a second beam before the first beam is transmitted through the surface of the first lightguide to exit the first lightguide;

a beam directing device which directs the second beam from the first lightguide into the second lightguide; and wherein the second lightguide comprises a beam directing device which directs the second beam into the second predefined direction.

10. A device including a proximity sensor comprising:

a transmitter including a first lightguide which directs a first beam into a first predefined direction and which includes a surface through which the first beam is transmitted to exit the first lightguide;

a receiver;

a lightguide system used with the receiver;

a second lightguide which directs a reflection of the first beam into a second predefined direction;

a beam splitter within the first lightguide which splits an incident beam into the first beam and into a second beam before the first beam is transmitted through the surface of the first lightguide to exit the first lightguide; and a beam directing device which directs the second beam from the first lightguide into the second lightguide; and wherein the second lightguide comprises a beam directing device which directs the second beam into the second predefined direction.

11. A lightguide system according to claim 5, wherein:

the second beam is directed from the first lightguide to the second lightguide via surfaces which do not direct the first beam.

12. A lightguide system according to claim 5, wherein:

the directing device directs the second beam from the first lightguide to the second lightguide via surfaces which also direct the first beam.

13. A lightguide system according to claim 11, wherein:

the second beam is directed from the first lightguide to the second lightguide via surfaces which do not direct the first beam.

* * * * *

UNITED STATES PATENT AND TRADEMARK OFFICE
CERTIFICATE OF CORRECTION

PATENT NO. : 6,835,923 B2
DATED : December 28, 2004
INVENTOR(S) : Tiina Hämäläinen et al.

It is certified that error appears in the above-identified patent and that said Letters Patent is hereby corrected as shown below:

Title page,
Item [75], Inventors, should read -- Tiina Hämäläinen, Trc (FI); Henri Vähä-Ypyä, Tampere (FI); Risto Pirhonen, Tampere (FI); Vesa Pelli, Tampere (FI) --.

Signed and Sealed this

Eighteenth Day of October, 2005

JON W. DUDAS
*Director of the United States Patent and Trademark Office*